US012658889B2

(12) United States Patent　　(10) Patent No.: US 12,658,889 B2

Khlat　　(45) Date of Patent: Jun. 16, 2026

(54) ACOUSTIC TUNING NETWORK IN AN ACOUSTIC FILTER CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 32 days.

(21) Appl. No.: 18/616,708

(22) Filed: Mar. 26, 2024

(65) Prior Publication Data

US 2024/0333257 A1　　Oct. 3, 2024

Related U.S. Application Data

(60) Provisional application No. 63/469,623, filed on May 30, 2023, provisional application No. 63/493,333, (Continued)

(51) Int. Cl.
　　*H03H 9/54*　　(2006.01)
　　*H03H 9/205*　　(2006.01)

(52) U.S. Cl.
　　CPC ............ *H03H 9/542* (2013.01); *H03H 9/205* (2013.01)

(58) Field of Classification Search
　　CPC ...... H03H 9/542; H03H 9/6483; H03H 9/605; H03H 9/205; H03H 9/568; H03H 2009/02204; H03H 7/09; H03H 2210/025; H03H 9/64; H03H 9/6403; H03H 9/706; H03H 2009/02196; H03H 9/584; H03H 9/585; H03H 2210/036; H03H 9/0095; H03H 9/54; H03H 9/545; H03H 9/547; H03H 2210/033; H03H 9/60; H03H 9/6409; H03H 9/725; H03H 9/6406; H03H 9/6489; H03H 2009/02165; H03H 7/38;

(Continued)

(56) References Cited

U.S. PATENT DOCUMENTS

| 3,568,108 A | 3/1971 | Poirier et al. |
| 4,924,195 A | 5/1990 | Gonda |

(Continued)

FOREIGN PATENT DOCUMENTS

| CN | 107727125 A | 2/2018 |
| DE | 102007028290 A1 | 1/2009 |

(Continued)

OTHER PUBLICATIONS

Gokhale, V. et al., "Phonon-Electron Interactions in Piezoelectric Semiconductor Bulk Acoustic Wave Resonators," Scientific Reports, vol. 4, Article No. 5617, Jul. 2014, 10 pages.

(Continued)

*Primary Examiner* — Lincoln D Donovan
*Assistant Examiner* — Tyler J Pereny
(74) *Attorney, Agent, or Firm* — Withrow & Terranova, P.L.L.C.

(57)　　　ABSTRACT

An acoustic tuning network is provided. In embodiments disclosed herein, the acoustic tuning network can be coupled in parallel to an acoustic resonator and tuned to either cancel an input current or an output current of the acoustic resonator. As such, it is possible to provide multiple acoustic tuning networks in an acoustic filter circuit having multiple acoustic resonators to enable a variety of application scenarios.

20 Claims, 11 Drawing Sheets

Related U.S. Application Data filed on Mar. 31, 2023, provisional application No. 63/493,328, filed on Mar. 31, 2023.

(58) Field of Classification Search
CPC .. H03H 9/0004; H04B 1/0458; H04B 1/0057; H04B 1/006; H04B 1/40; H04B 1/525; H04B 10/50; H03F 2200/451; H03F 1/56; H03F 2200/111; H03F 2200/294; H03F 3/19; H03F 1/565; H03F 3/195; H03F 3/24

See application file for complete search history.

(56) References Cited

U.S. PATENT DOCUMENTS

| | | | |
|---|---|---|---|
| 6,242,843 B1 | 6/2001 | Pohjonen et al. | |
| 6,862,441 B2 | 3/2005 | Ella | |
| 7,034,638 B2 | 4/2006 | Yamamoto et al. | |
| 7,161,434 B2 | 1/2007 | Rhodes | |
| 7,367,095 B2 | 5/2008 | Larson, III et al. | |
| 7,454,178 B2 | 11/2008 | Block et al. | |
| 7,573,354 B2 | 8/2009 | Nishihara et al. | |
| 7,656,228 B2 | 2/2010 | Fukuda et al. | |
| 7,659,796 B2 | 2/2010 | Funami et al. | |
| 7,692,270 B2 | 4/2010 | Subramanyam et al. | |
| 7,791,436 B2 | 9/2010 | Bardal et al. | |
| 7,804,374 B1 | 9/2010 | Brown et al. | |
| 7,876,179 B2 | 1/2011 | Bauer et al. | |
| 8,269,577 B2 | 9/2012 | Inoue et al. | |
| 8,576,024 B2 | 11/2013 | Erb et al. | |
| 8,620,250 B2 | 12/2013 | Erb | |
| 9,041,484 B2 | 5/2015 | Burgener et al. | |
| 9,190,979 B2 | 11/2015 | Granger-Jones et al. | |
| 9,255,912 B2 | 2/2016 | Johnston et al. | |
| 9,281,800 B2 | 3/2016 | Tsuzuki | |
| 9,438,202 B2 | 9/2016 | Reinhardt et al. | |
| 9,583,806 B2 | 2/2017 | Cho et al. | |
| 9,705,473 B2 | 7/2017 | David et al. | |
| 9,819,327 B2 | 11/2017 | Maruthamuthu et al. | |
| 9,847,769 B2 | 12/2017 | Khlat et al. | |
| 10,009,010 B2 | 6/2018 | Kando et al. | |
| 10,243,537 B2 | 3/2019 | Khlat | |
| 10,425,061 B1 | 9/2019 | Varela Campelo | |
| 10,447,322 B2 | 10/2019 | Wloczysiak | |
| 10,476,481 B2 | 11/2019 | Chen et al. | |
| 10,873,317 B2 | 12/2020 | Shen et al. | |
| 10,985,731 B2 | 4/2021 | Khlat | |
| 11,025,224 B2 * | 6/2021 | Khlat | H03H 9/605 |
| 11,050,412 B2 | 6/2021 | Khlat et al. | |
| 11,095,268 B2 | 8/2021 | Schmidhammer | |
| 11,165,412 B2 | 11/2021 | Khlat et al. | |
| 11,165,413 B2 | 11/2021 | Khlat et al. | |
| 11,323,097 B2 | 5/2022 | Kankar et al. | |
| 11,742,818 B2 | 8/2023 | Khlat | |
| 2002/0021192 A1 | 2/2002 | Klee et al. | |
| 2002/0158717 A1 | 10/2002 | Toncich | |
| 2002/0163400 A1 | 11/2002 | Toncich | |
| 2003/0227338 A1 | 12/2003 | Kawakubo et al. | |
| 2004/0119561 A1 | 6/2004 | Omote | |
| 2006/0098723 A1 | 5/2006 | Toncich et al. | |
| 2007/0030096 A1 | 2/2007 | Nishihara et al. | |
| 2007/0107519 A1 | 5/2007 | Liu et al. | |
| 2007/0131032 A1 | 6/2007 | Liu | |
| 2007/0296513 A1 | 12/2007 | Ruile et al. | |
| 2008/0024243 A1 | 1/2008 | Iwaki et al. | |
| 2008/0065290 A1 | 3/2008 | Breed et al. | |
| 2008/0129416 A1 | 6/2008 | Volatier et al. | |
| 2009/0289526 A1 | 11/2009 | Sinha et al. | |
| 2009/0315643 A1 | 12/2009 | Yamakawa et al. | |
| 2010/0308933 A1 | 12/2010 | See et al. | |
| 2012/0212304 A1 | 8/2012 | Zhang et al. | |
| 2012/0313731 A1 | 12/2012 | Burgener et al. | |
| 2013/0109332 A1 | 5/2013 | Aigner | |
| 2014/0070905 A1 * | 3/2014 | Raieszadeh | H03H 7/1775 |
| | | | 333/174 |
| 2014/0203887 A1 | 7/2014 | Murata et al. | |
| 2015/0163044 A1 | 6/2015 | Analui et al. | |
| 2016/0191012 A1 | 6/2016 | Khlat et al. | |
| 2016/0191016 A1 | 6/2016 | Khlat et al. | |
| 2016/0294423 A1 | 10/2016 | Yatsenko et al. | |
| 2017/0040948 A1 | 2/2017 | Levesque | |
| 2017/0048859 A1 | 2/2017 | Hayakawa | |
| 2017/0093370 A1 * | 3/2017 | Khlat | H03H 9/02086 |
| 2017/0201233 A1 | 7/2017 | Khlat | |
| 2017/0214389 A1 * | 7/2017 | Tsutsumi | H03H 9/6483 |
| 2017/0230066 A1 | 8/2017 | Little et al. | |
| 2017/0244382 A1 | 8/2017 | Lear | |
| 2017/0264268 A1 | 9/2017 | Schmidhammer | |
| 2018/0076793 A1 | 3/2018 | Khlat et al. | |
| 2018/0123562 A1 | 5/2018 | Bradley | |
| 2018/0159562 A1 | 6/2018 | Bauder | |
| 2018/0234078 A1 | 8/2018 | Wada et al. | |
| 2019/0081613 A1 | 3/2019 | Nosaka | |
| 2019/0181907 A1 | 6/2019 | Pfann et al. | |
| 2019/0199324 A1 | 6/2019 | Matsumoto et al. | |
| 2019/0260355 A1 | 8/2019 | Khlat | |
| 2019/0326944 A1 | 10/2019 | Khlat et al. | |
| 2019/0393860 A1 | 12/2019 | Shih et al. | |
| 2020/0028491 A1 | 1/2020 | Kuroyanagi | |
| 2020/0028567 A1 | 1/2020 | Ashworth | |
| 2020/0076366 A1 | 3/2020 | Bahr et al. | |
| 2020/0099360 A1 | 3/2020 | Khlat | |
| 2020/0099362 A1 | 3/2020 | Khlat | |
| 2020/0099363 A1 | 3/2020 | Khlat | |
| 2020/0099364 A1 | 3/2020 | Khlat | |
| 2020/0136589 A1 | 4/2020 | Khlat | |
| 2020/0162057 A1 | 5/2020 | Nakamura | |
| 2020/0274519 A1 | 8/2020 | Gamble et al. | |
| 2021/0067139 A1 | 3/2021 | Komatsu et al. | |
| 2021/0194459 A1 | 6/2021 | Alavi et al. | |
| 2021/0297097 A1 | 9/2021 | Okuda | |
| 2021/0399750 A1 | 12/2021 | Varela Campelo | |
| 2022/0385272 A1 | 12/2022 | Sun et al. | |
| 2023/0083961 A1 | 3/2023 | Komatsu et al. | |
| 2023/0093885 A1 | 3/2023 | Ella et al. | |
| 2023/0134889 A1 | 5/2023 | Costa | |
| 2023/0216485 A1 | 7/2023 | Wu et al. | |
| 2023/0223920 A1 | 7/2023 | Koohi et al. | |
| 2023/0223922 A1 | 7/2023 | Koohi et al. | |
| 2023/0223926 A1 | 7/2023 | Koohi et al. | |
| 2023/0299746 A1 | 9/2023 | Levesque | |
| 2023/0318569 A1 | 10/2023 | Jhung | |
| 2023/0402992 A1 | 12/2023 | Noguchi et al. | |
| 2023/0412149 A1 | 12/2023 | Khlat | |
| 2024/0014803 A1 | 1/2024 | Khlat | |
| 2024/0053193 A1 | 2/2024 | Khlat | |
| 2024/0097650 A1 | 3/2024 | Khlat et al. | |
| 2024/0213956 A1 | 6/2024 | Khlat et al. | |
| 2024/0258992 A1 | 8/2024 | Khlat | |
| 2024/0333259 A1 | 10/2024 | Khlat | |
| 2024/0364309 A1 | 10/2024 | Khlat | |
| 2024/0413809 A1 | 12/2024 | Khlat | |

FOREIGN PATENT DOCUMENTS

| | | | |
|---|---|---|---|
| JP | 3854212 B2 | 12/2006 | |
| JP | 2009130831 A | 6/2009 | |
| JP | 4326063 B2 | 9/2009 | |
| JP | 2022548348 A | 11/2022 | |
| RU | 166154 U1 | 11/2016 | |
| WO | 2024034528 A1 | 2/2024 | |

OTHER PUBLICATIONS

Sis, S.A., "Ferroelectric-on-Silicon Switchable Bulk Acoustic Wave Resonators and Filters for RF Applications," A dissertation submitted in partial fulfillment of the requirements for the degree of Doctor of Philosophy (Electrical Engineering) in The University of Michigan, 2014, 152 pages.

Tirado, J.V., "Bulk Acoustic Wave Resonators and their Application to Microwave Devices," Ph.D Dissertation, Department of Telecommunications and Systems Engineering, Universitat Autonoma

(56)    References Cited

OTHER PUBLICATIONS de Barcelona (UAB), 2010, 201 pages.

Elkholy, M. et al., "Low-Loss Integrated Passive CMOS Electrical Balance Duplexers With Single-Ended LNA," IEEE Transactions on Microwave Theory and Techniques, vol. 64, No. 5, May 2016, IEEE, pp. 1544-1559.

Kang, P. et al., "Dual-Band CMOS RF Front-End Employing an Electrical-Balance Duplexer an N-Path LNA for IBFD and FDD Radios," IEEE Transactions on Microwave Theory and Techniques, vol. 69, No. 7, Jul. 2021, IEEE, pp. 3528-3539.

Yu, X., "Design of reconfigurable multi-mode RF circuits," A dissertation submitted to the graduate faculty in partial fulfillment of the requirements for the degree of Doctor of Philosophy, Iowa State University, Ames, Iowa, 2013, 127 pages.

Khan, A.I. et al., "Negative Capacitance in a Ferroelectric Capacitor," Nature Materials, vol. 14, Feb. 2015, first published Dec. 2014, Macmillan Publishers Limited, pp. 182-186.

Ghosh, S. et al., "Experimental Observation of Electron-Phonon Interaction in Semiconductor on Solidly Mounted Thin-Film Lithium Niobate," 2022 IEEE MTT-S International Conference on Microwave Acoustics and Mechanics (IC-MAM), Jul. 18-20, 2022, Munich, Germany, IEEE, 4 pages.

Qorvo US, Inc., "Acoustic LP filtering for High Frequency Spurious Harmonics Rejections," Technical Disclosure Commons, Dec. 13, 2022, Qorvo US, Inc., 8 pages.

Qorvo US, Inc., "Multipe Notch Filter Using On-Die BAW MIM Cap," Technical Disclosure Commons, Dec. 12, 2022, Qorvo US, Inc., 10 pages.

* cited by examiner

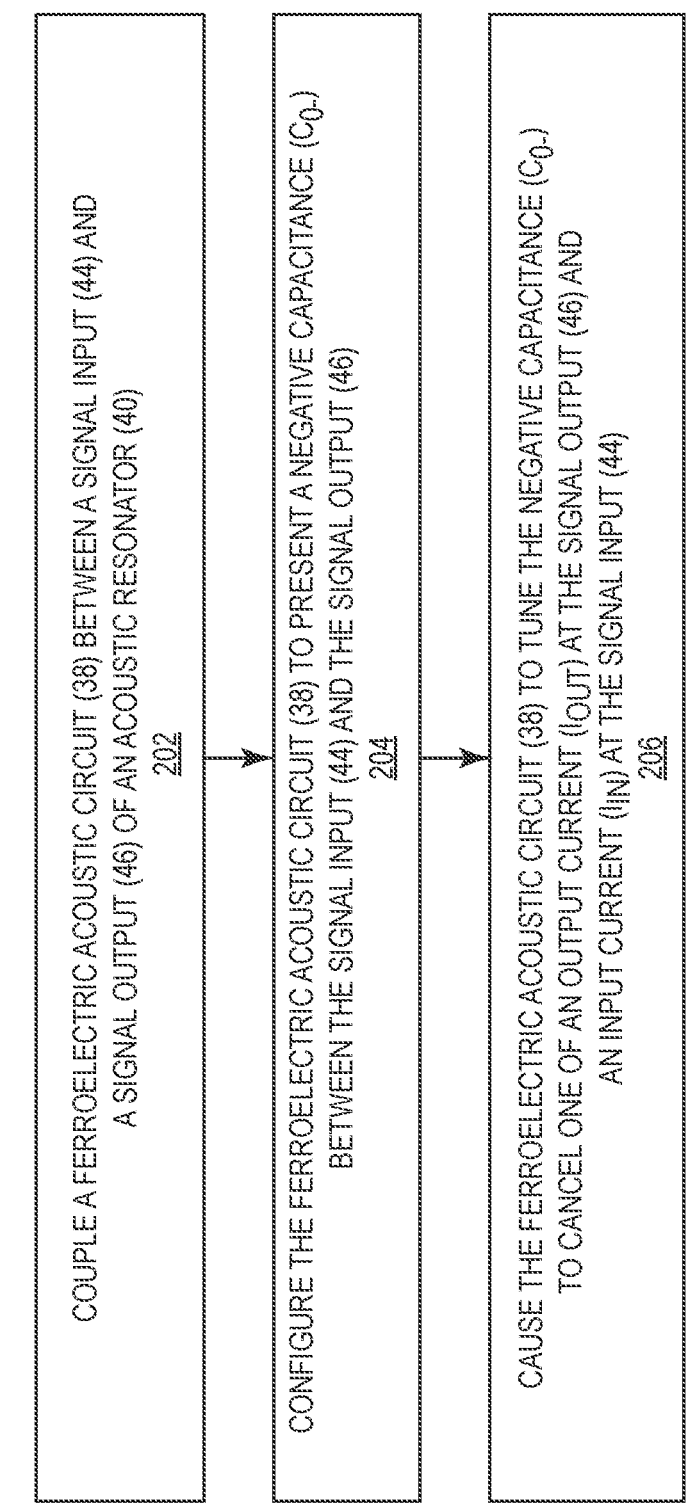

COUPLE A FERROELECTRIC ACOUSTIC CIRCUIT (38) BETWEEN A SIGNAL INPUT (44) AND A SIGNAL OUTPUT (46) OF AN ACOUSTIC RESONATOR (40)
202

CONFIGURE THE FERROELECTRIC ACOUSTIC CIRCUIT (38) TO PRESENT A NEGATIVE CAPACITANCE ($C_{Q-}$) BETWEEN THE SIGNAL INPUT (44) AND THE SIGNAL OUTPUT (46)
204

CAUSE THE FERROELECTRIC ACOUSTIC CIRCUIT (38) TO TUNE THE NEGATIVE CAPACITANCE ($C_{Q-}$) TO CANCEL ONE OF AN OUTPUT CURRENT ($I_{OUT}$) AT THE SIGNAL OUTPUT (46) AND AN INPUT CURRENT ($I_{IN}$) AT THE SIGNAL INPUT (44)
206

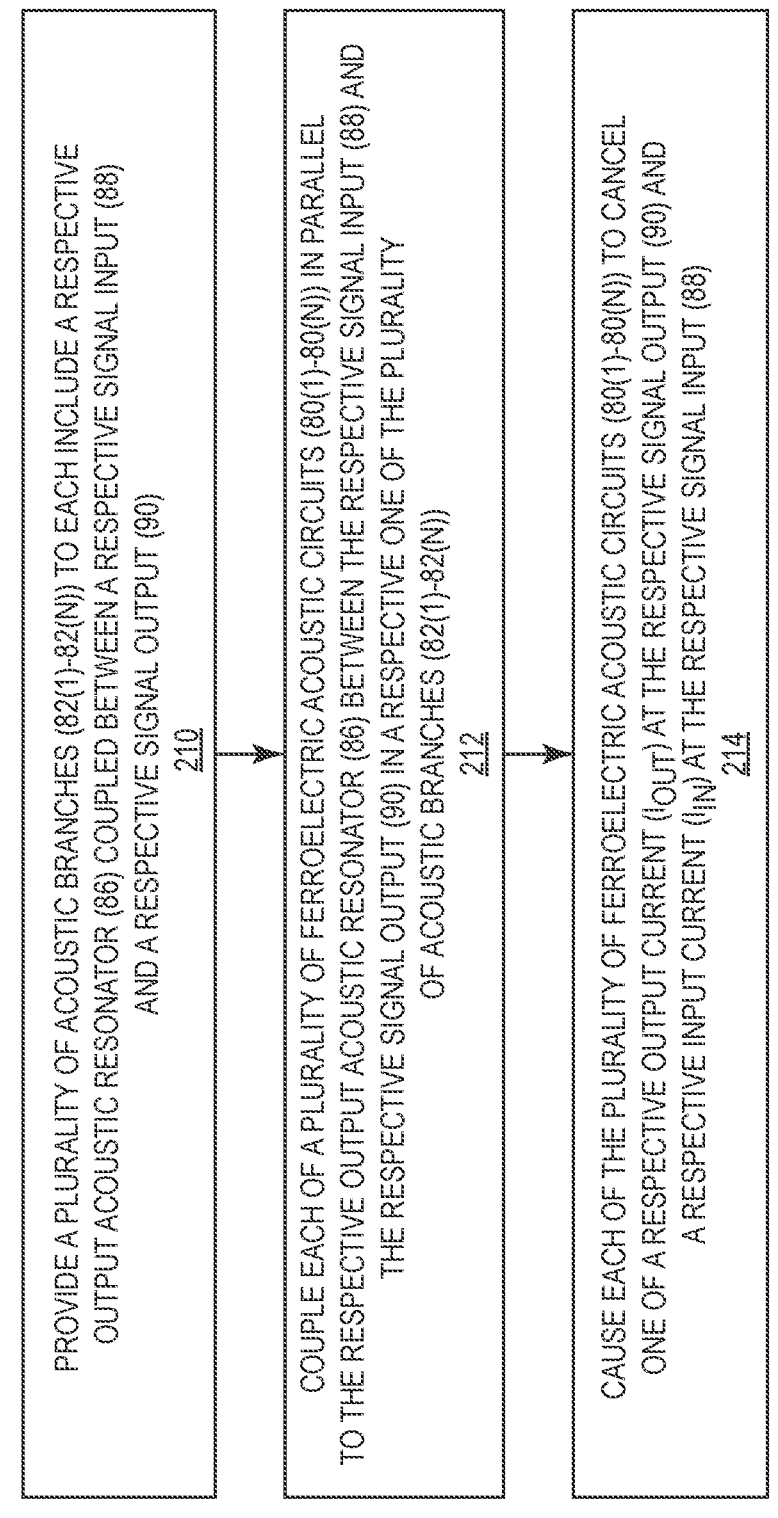

208

PROVIDE A PLURALITY OF ACOUSTIC BRANCHES (82(1)-82(N)) TO EACH INCLUDE A RESPECTIVE OUTPUT ACOUSTIC RESONATOR (86) COUPLED BETWEEN A RESPECTIVE SIGNAL INPUT (88) AND A RESPECTIVE SIGNAL OUTPUT (90)
210

COUPLE EACH OF A PLURALITY OF FERROELECTRIC ACOUSTIC CIRCUITS (80(1)-80(N)) IN PARALLEL TO THE RESPECTIVE OUTPUT ACOUSTIC RESONATOR (86) BETWEEN THE RESPECTIVE SIGNAL INPUT (88) AND THE RESPECTIVE SIGNAL OUTPUT (90) IN A RESPECTIVE ONE OF THE PLURALITY OF ACOUSTIC BRANCHES (82(1)-82(N))
212

CAUSE EACH OF THE PLURALITY OF FERROELECTRIC ACOUSTIC CIRCUITS (80(1)-80(N)) TO CANCEL ONE OF A RESPECTIVE OUTPUT CURRENT ($I_{OUT}$) AT THE RESPECTIVE SIGNAL OUTPUT (90) AND A RESPECTIVE INPUT CURRENT ($I_{IN}$) AT THE RESPECTIVE SIGNAL INPUT (88)
214

FIG. 10

ACOUSTIC TUNING NETWORK IN AN ACOUSTIC FILTER CIRCUIT

RELATED APPLICATIONS

This application claims the benefit of U.S. provisional patent application Ser. No. 63/493,328, filed on Mar. 31, 2023, U.S. provisional patent application Ser. No. 63/493,333, filed on Mar. 31, 2023, and U.S. provisional patent application Ser. No. 63/469,623, filed on May 30, 2023, the disclosures of which are hereby incorporated herein by reference in their entireties.

FIELD OF THE DISCLOSURE

The technology of the disclosure relates generally to an acoustic tuning network in an acoustic filter circuit.

BACKGROUND

Wireless devices have become increasingly common in current society. The prevalence of these wireless devices is driven in part by the many functions that are now enabled on such devices for supporting a variety of applications. In this regard, a wireless device may employ a variety of circuits and/or components (e.g., filters, transceivers, antennas, and so on) to support different numbers and/or types of applications.

Ferroelectric acoustic resonators, such as ferroelectric bulk acoustic resonators (FBARs), are ultra-small in size and can operate at frequencies up to tens of gigahertz. As such, ferroelectric resonators are widely used as miniaturized filters in many high-frequency devices, such as fifth generation (5G) and 5G new radio (5G-NR) communication and/or navigation devices. The operating frequency (a.k.a. a series/parallel resonance frequency) of a ferroelectric acoustic resonator is typically determined by an inner structure (e.g., thickness and elastic properties) of the ferroelectric acoustic resonator. As such, it is desirable to electrically control the ferroelectric acoustic resonator to operate at a desired operating frequency without changing the inner structure of the ferroelectric acoustic resonator.

SUMMARY

Aspects disclosed in the detailed description include an acoustic tuning network. In embodiments disclosed herein, the acoustic tuning network can be coupled in parallel to an acoustic resonator and tuned to either cancel an input current or an output current of the acoustic resonator. As such, it is possible to provide multiple acoustic tuning networks in an acoustic filter circuit having multiple acoustic resonators to enable a variety of application scenarios.

In one aspect, an acoustic tuning network is provided. The acoustic tuning network includes a ferroelectric acoustic circuit. The ferroelectric acoustic circuit is coupled between a signal input and a signal output of an acoustic resonator. The ferroelectric acoustic circuit is configured to present a negative capacitance between the signal input and the signal output. The acoustic tuning network also includes a control circuit. The control circuit is configured to cause the ferroelectric acoustic circuit to tune the negative capacitance to cancel one of an output current at the signal output and an input current at the signal input.

In another aspect, an acoustic filter circuit is provided. The acoustic filter circuit includes multiple acoustic branches. Each of the multiple acoustic branches includes a respective output acoustic resonator coupled between a respective signal input and a respective signal output. The acoustic filter circuit also includes multiple ferroelectric acoustic circuits. Each of the multiple ferroelectric acoustic circuits is coupled in parallel to the respective output acoustic resonator between the respective signal input and the respective signal output in a respective one of the multiple acoustic branches. The acoustic filter circuit also includes a control circuit. The control circuit is configured to cause each of the multiple ferroelectric acoustic circuits to cancel one of a respective output current at the respective signal output and a respective input current at the respective signal input.

In another aspect, a wireless device is provided. The wireless device includes an acoustic tuning network. The acoustic tuning network includes a ferroelectric acoustic circuit. The ferroelectric acoustic circuit is coupled between a signal input and a signal output of an acoustic resonator. The ferroelectric acoustic circuit is configured to present a negative capacitance between the signal input and the signal output. The acoustic tuning network also includes a control circuit. The control circuit is configured to cause the ferroelectric acoustic circuit to tune the negative capacitance to cancel one of an output current at the signal output and an input current at the signal input.

In another aspect, a wireless device is provided. The wireless device includes an acoustic filter circuit. The acoustic filter circuit includes multiple acoustic branches. Each of the multiple acoustic branches includes a respective output acoustic resonator coupled between a respective signal input and a respective signal output. The acoustic filter circuit also includes multiple ferroelectric acoustic circuits. Each of the multiple ferroelectric acoustic circuits is coupled in parallel to the respective output acoustic resonator between the respective signal input and the respective signal output in a respective one of the multiple acoustic branches. The acoustic filter circuit also includes a control circuit. The control circuit is configured to cause each of the multiple ferroelectric acoustic circuits to cancel one of a respective output current at the respective signal output and a respective input current at the respective signal input.

In another aspect, a method for operating an acoustic tuning network is provided. The method includes coupling a ferroelectric acoustic circuit between a signal input and a signal output of an acoustic resonator. The method also includes configuring the ferroelectric acoustic circuit to present a negative capacitance between the signal input and the signal output. The method also includes causing the ferroelectric acoustic circuit to tune the negative capacitance to cancel one of an output current at the signal output and an input current at the signal input.

In another aspect, a method for operating an acoustic filter circuit is provided. The method includes providing multiple acoustic branches to each include a respective output acoustic resonator coupled between a respective signal input and a respective signal output. The method also includes coupling each of multiple ferroelectric acoustic circuits in parallel to the respective output acoustic resonator between the respective signal input and the respective signal output in a respective one of the multiple acoustic branches. The method also includes causing each of the multiple ferroelectric acoustic circuits to cancel one of a respective output current at the respective signal output and a respective input current at the respective signal input.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

FIG. 9 is a flowchart of an exemplary process for operating the acoustic tunning network of FIG. 2; and FIG. 10 is a flowchart of an exemplary process for configuring the acoustic filter circuit of FIG. 7.

DETAILED DESCRIPTION

Figure 1B:
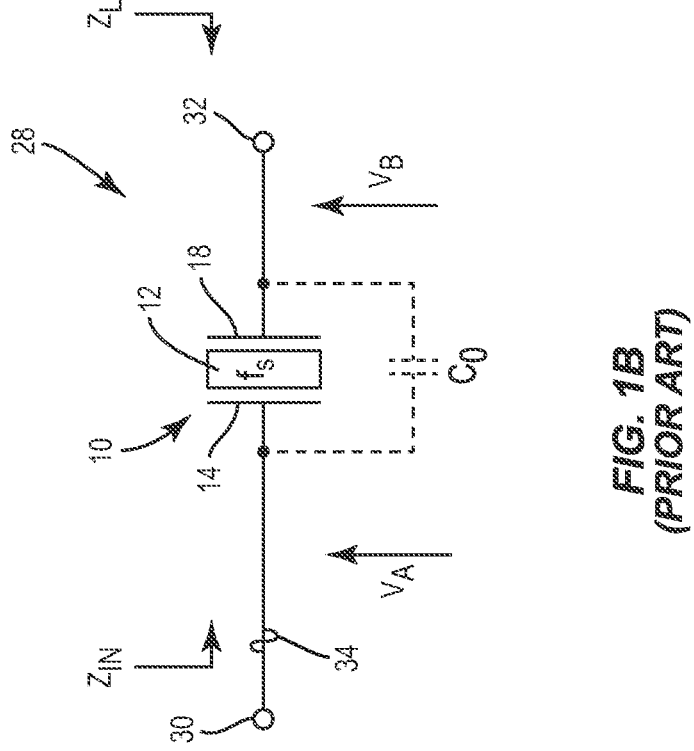
FIG. 1B is a schematic diagram of a radio frequency (RF) filter configured based on the BAW resonator of FIG. 1A.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include an acoustic tuning network. In embodiments disclosed herein, the acoustic tuning network can be coupled in parallel to an acoustic resonator and tuned to either cancel an input current or an output current of the acoustic resonator. As such, it is possible to provide multiple acoustic tuning networks in an acoustic filter circuit having multiple acoustic resonators to enable a variety of application scenarios.

Figure 1A:
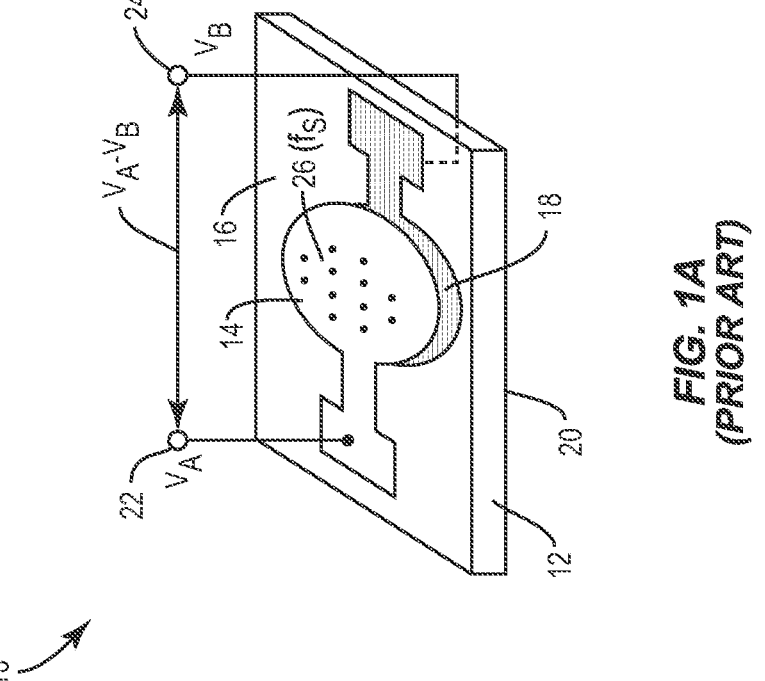
FIG. 1A is a schematic diagram of an exemplary bulk acoustic wave (BAW) resonator.
Figure 2:
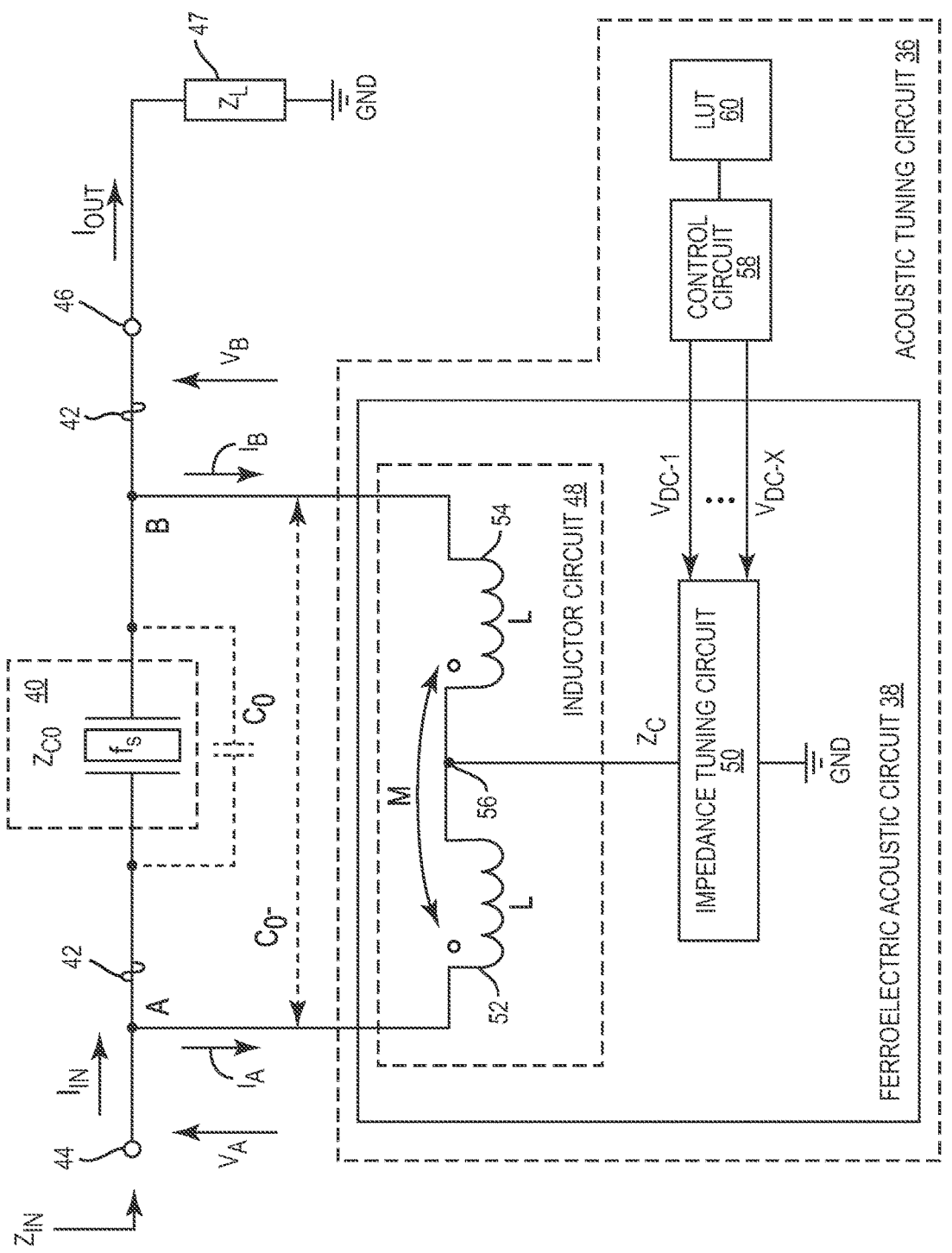
FIG. 2 is a schematic diagram of an acoustic tuning network, wherein a ferroelectric acoustic circuit can be configured according to embodiments of the present disclosure not only to cancel an electrical capacitance associated with an acoustic resonator but also to selectively cancel an input current or an output current of the acoustic resonator.

Before discussing an acoustic tuning network of the present disclosure, starting at FIG. 2, a brief overview of a bulk acoustic wave (BAW) resonator, which may cause an electrical capacitance in parallel to the BAW resonator, is first provided with reference to FIGS. 1A and 1B.

FIG. 1A is a schematic diagram of an exemplary BAW resonator 10. The BAW resonator 10 includes a piezo layer 12 (e.g., a quartz crystal), a first metal electrode 14 disposed on a top surface 16 of the piezo layer 12, and a second metal electrode 18 disposed on a bottom surface 20 of the piezo layer 12. When a first voltage $V_A$ and a second voltage $V_B$ are applied to a top electrical port 22 and a bottom electrical port 24, respectively, an acoustic wave 26 is excited and resonates in a serial resonance frequency $f_S$ between the top surface 16 and the bottom surface 20 of the piezo layer 12. The serial resonance frequency $f_S$ may be related to a thickness of the piezo layer 12 and/or a mass of the first metal electrode 14 and the second metal electrode 18.

The BAW resonator 10 can be configured to function as an RF filter in an RF circuit. In this regard, FIG. 1B is a schematic diagram of an RF filter 28 configured based on the BAW resonator 10 of FIG. 1A. Common elements between FIGS. 1A and 1B are shown therein with common element numbers and will not be re-described herein.

In the RF filter 28, the BAW resonator 10 may be provided between an input port 30 and an output port 32. When the BAW resonator 10 resonates in the serial resonance frequency $f_S$, the BAW resonator 10 functions as a short circuit to pass an RF signal 34 from the input port 30 to the output port 32. In contrast, the BAW resonator 10 functions as an open circuit to block the RF signal 34 outside the serial resonance frequency $f_S$. As such, a respective bandwidth of the serial resonance frequency $f_S$ determines a passband bandwidth of the RF filter 28.

However, the first metal electrode 14 and the second metal electrode 18 in the BAW resonator 10 may create an electrical capacitance $C_0$ outside the serial resonance frequency $f_S$. Notably, the electrical capacitance $C_0$ can cause the BAW resonator 10 to resonate at a parallel resonance frequency outside the serial resonance frequency $f_S$. Consequently, the RF filter 28 may not be able to effectively reject the RF signal 34 outside the serial resonance frequency $f_S$, thus compromising performance of the RF filter 28. As such, it is desirable to eliminate the electrical capacitance $C_0$ presented by the BAW resonator 10.

In a non-limiting example, the input port 30 can be coupled to a power amplifier circuit (not shown) to receive the RF signal 34 and the output port 32 can be coupled to an antenna circuit (not shown) to transmit the RF signal 34. As such, the input port 30 may see an input impedance $Z_{IN}$ and the output port 32 may see a load impedance $Z_L$. As such, when the output port 32 is coupled to different load circuits associated with a different load impedance $Z_L$, it is also desirable to ensure that the input impedance $Z_{IN}$ is not affected (a.k.a. changed) by the different load impedance $Z_L$.

In this regard, FIG. 2 is a schematic diagram of an acoustic tuning network 36, wherein a ferroelectric acoustic circuit 38 can be configured according to embodiments of the present disclosure not only to cancel an electrical capacitance $C_0$ associated with an acoustic resonator 40 but also to selectively cancel an input current $I_{IN}$ or an output current $I_{OUT}$ of the acoustic resonator 40. In a non-limiting example, the acoustic resonator 40 can be the same as the BAW resonator 10 of FIG. 1A. Accordingly, the acoustic resonator 40 can resonate at a serial resonance frequency $f_S$ to pass a signal 42 from a signal input 44 to a signal output 46 and block the signal 42 outside the serial resonance frequency $f_S$. The signal input 44 may be coupled to a power amplifier circuit (not shown), which presents an input impedance $Z_{IN}$, and the signal output 46 may be coupled to a load circuit 47 (e.g., antenna circuit) that presents a load impedance $Z_L$. As discussed below, the acoustic tuning network 36 can cause the input impedance $Z_{IN}$ to be independent from the load impedance $Z_L$ by selectively cancelling the input current $I_{IN}$ or the output current $I_{OUT}$ of the acoustic resonator 40. As a result, it is possible to flexibly use the acoustic resonator 40 with various load circuits that present the different load impedance $Z_L$.

Like the BAW resonator 10, the acoustic resonator 40 can also create an electrical capacitance $C_0$ outside the serial resonance frequency $f_S$. Understandably from the previous discussion in FIG. 1B, the electrical capacitance $C_0$ may compromise the performance of the acoustic resonator 40. As such, it is necessary to cancel the electrical capacitance $C_0$ outside the serial resonance frequency $f_S$.

Herein, the ferroelectric acoustic circuit 38 is provided between the signal input 44 and the signal output 46, in parallel to the acoustic resonator 40. In an embodiment, the ferroelectric acoustic circuit 38 includes an inductor circuit 48 and an impedance tuning circuit 50. The inductor circuit 48 includes a first inductor 52 and a second inductor 54, which are negatively coupled between the signal input 44 and the signal output 46. Each of the first inductor 52 and the second inductor 54 is configured to have a self-inductance L. When the first voltage $V_A$ is applied, a first time-variant current IA is induced, in the first inductor 52. The first time-variant current IA can induce a time-variant magnetic field (not shown) that is coupled to the second inductor 54. The amount of the magnetic field being coupled from the first inductor 52 to the second inductor 54 can be described based on a coupling factor k ($0 \le k \le 1$). When the coupling factor k equals zero (0), it means that none of the magnetic field is coupled from the first inductor 52 to the second inductor 54. In contrast, when the coupling factor k equals one (1), it means that all of the magnetic field is coupled from the first inductor 52 to the second inductor 54.

When the coupling factor k is greater than 0 (k>0), some or all of the magnetic field is coupled from the first inductor 52 to the second inductor 54. The time-variant magnetic field can cause a second voltage $V_B$, which can further induce a second time-variant current $I_B$, in the second inductor 54. Collectively, the first inductor 52 and the second inductor 54 present a mutual-inductance M (M=–kL) between the signal input 44 and the signal output 46.

The inductor circuit 48 can be coupled to the impedance tuning circuit 50 via an intermediate node 56 located in between the first inductor 52 and the second inductor 54. More specifically, the impedance tuning circuit 50 is coupled between the intermediate node 56 and a ground (GND). The impedance tuning circuit 50 can be tuned to present a shunt impedance $Z_C$. As described in U.S. Pat. No. 10,985,731 B2, entitled "ACOUSTIC RESONATOR STRUCTURE," by tuning the shunt impedance $Z_C$ in relation to an inherent impedance $Z_{CO}$ of the acoustic resonator 40, it is possible to create a negative capacitance $C_{0-}$ to cancel the electrical capacitance $C_0$ and, therefore, improve performance of the acoustic resonator 40.

In an embodiment, the acoustic tuning network 36 can include a control circuit 58. Herein, the control circuit 58 is configured to tune the shunt impedance $Z_C$ and, therefore, the negative capacitance $C_{0-}$ to thereby cancel the equivalent capacitance $C_0$. More specifically, the control circuit 58 can tune the shunt impedance $Z_C$ by applying at least one set of tuning voltages $V_{DC-1}$-$V_{DC-X}$ to the impedance tuning circuit 50. In an embodiment, the set of tuning voltages $V_{DC-1}$-$V_{DC-X}$ may be predetermined and stored in a voltage lookup table (LUT) 60. Accordingly, the control circuit 58 may determine the set of tuning voltages $V_{DC-1}$-$V_{DC-X}$ based on the voltage LUT 60.

The impedance tuning circuit 50 can be configured according to some embodiments of the present disclosure, as described below in FIGS. 3A and 3B. Common elements between FIGS. 2 and 3A-3B are shown therein with common element numbers and will not be re-described herein.

Figure 3A:
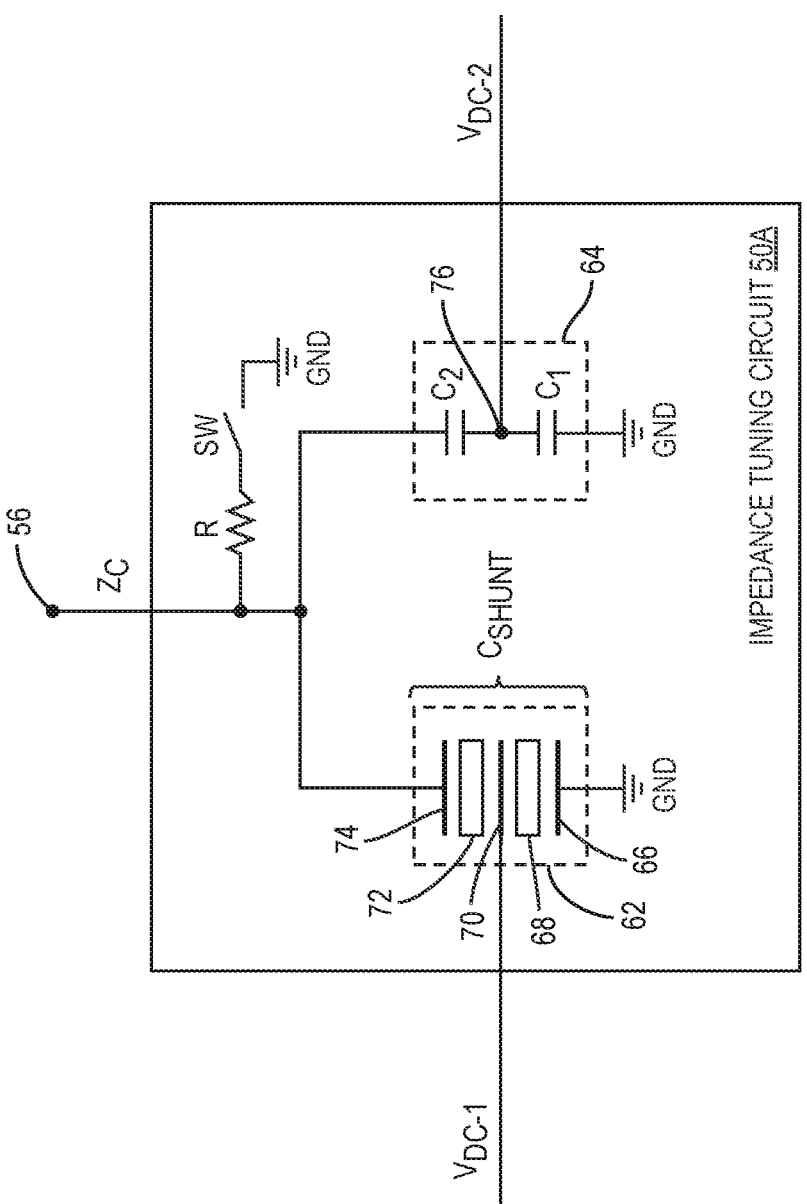
FIG. 3A is a schematic diagram illustrating an impedance tuning circuit in the ferroelectric acoustic circuit of FIG. 2.
Figure 3B:
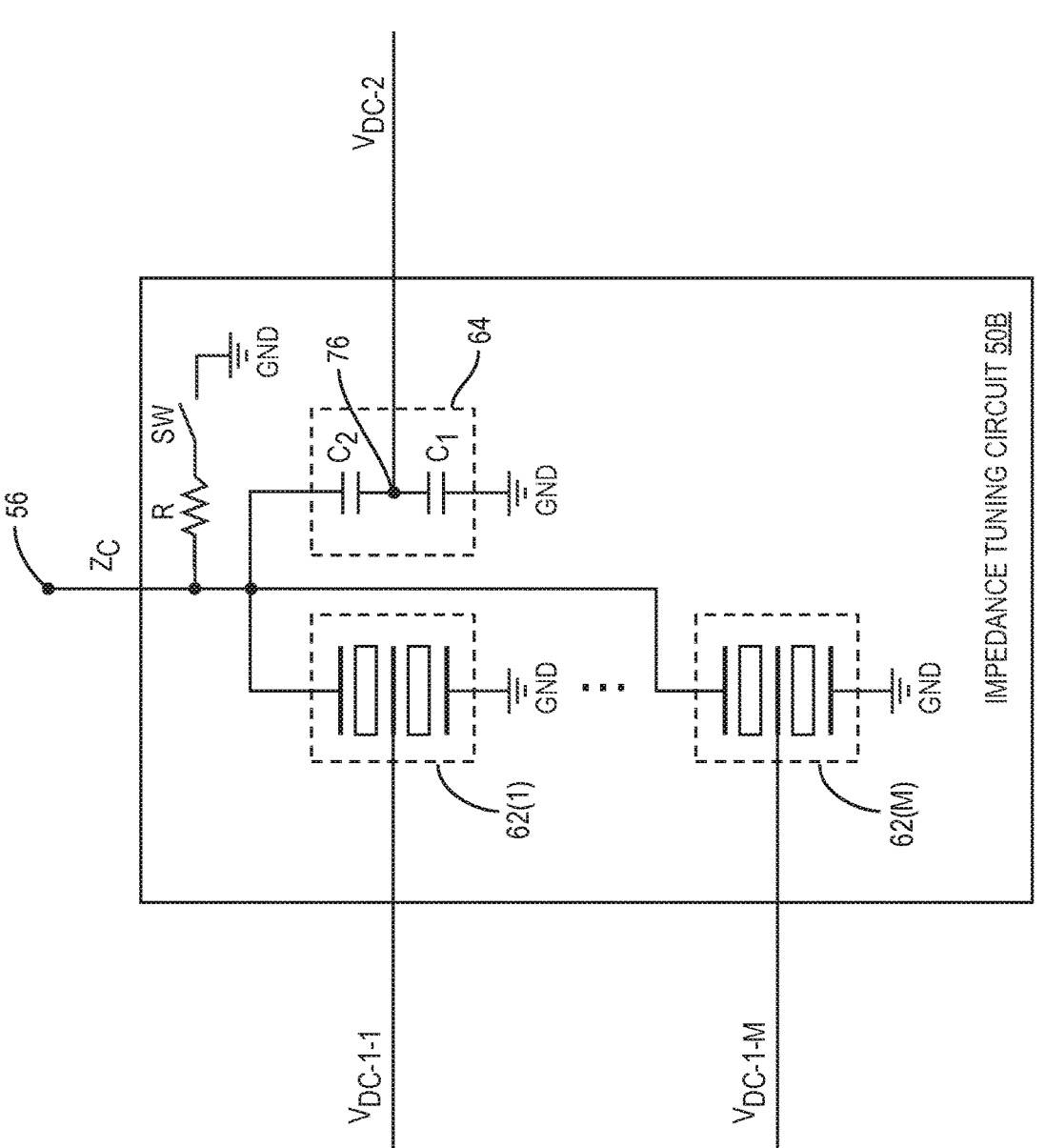
FIG. 3B is a schematic diagram illustrating another impedance tuning circuit in the ferroelectric acoustic circuit of FIG. 2.

FIG. 3A illustrates an impedance tuning circuit 50A configured according to one embodiment of the present disclosure. Herein, the impedance tuning circuit 50A includes a ferroelectric resonator 62, a ferroelectric capacitor network 64, and a resistor R. Each of the ferroelectric resonator 62, the ferroelectric capacitor network 64, and the resistor R is coupled between the intermediate node 56 and the GND.

Specifically, the ferroelectric resonator 62 includes a first electrode 66, a first piezoelectric layer 68, a center electrode 70, a second piezoelectric layer 72, and a second electrode 74. The first electrode 66 is coupled to the GND, the second electrode 74 is coupled to the intermediate node 56, and the center electrode 70 is coupled to the control circuit 58 to receive a first tuning voltage $V_{DC-1}$ among the set of tuning voltages $V_{DC-1}$-$V_{DC-X}$.

The ferroelectric capacitor network 64 includes a pair of ferroelectric capacitors $C_1$, $C_2$ that are coupled in series. Specifically, the ferroelectric capacitor $C_1$ is coupled to the GND and the ferroelectric capacitor $C_2$ is coupled to the intermediate node 56. The ferroelectric capacitor network 64 is configured to receive a second tuning voltage $V_{DC-2}$ among the set of tuning voltages $V_{DC-1}$-$V_{DC-X}$ via a center node 76 located in between the ferroelectric capacitors $C_1$, $C_2$. Collectively, the first tuning voltage $V_{DC-1}$ and the second tuning voltage $V_{DC-2}$ can cause the impedance tuning circuit 50A to tune the shunt impedance $Z_C$ and, thereby, adjust the negative capacitance $C_{0-}$ to cancel the electrical capacitance $C_0$ in FIG. 2.

The resistor R is coupled to the GND via a switch SW. In an embodiment, the resistor R can be used to control polarity of the first tuning voltage $V_{DC-1}$ and/or the second tuning voltage $V_{DC-2}$.

The ferroelectric resonator 62 can be tuned by the first tunning voltage $V_{DC-1}$ to form a shunt path outside the serial resonance frequency $f_S$ of the acoustic resonator 40 when the impedance tuning circuit 50A is provided in the ferroelectric acoustic circuit 38 and the ferroelectric acoustic circuit 38 is coupled between the signal input 44 and the signal output 46. Notably, the ferroelectric resonator 62 can also create an equivalent capacitance $C_{SHUNT}$, which can be removed by an equivalent capacitance of the ferroelectric capacitor network 64. By adding the ferroelectric capacitor network 64 in parallel to the ferroelectric resonator 62 and tuning the pair of ferroelectric capacitors $C_1$, $C_2$ appropriately, the impedance tuning circuit 50A can form an ideal capacitance across a desired frequency range(s) outside the serial resonance frequency $f_S$ of the acoustic resonator 40. Further, by concurrently tuning the ferroelectric resonator 62 and ferroelectric capacitor network 64, it is possible to attenuate a potential frequency blocker across a broad frequency bandwidth (e.g., 150 MHZ).

FIG. 3B illustrates an impedance tuning circuit 50B configured according to another embodiment of the present disclosure. Herein, the ferroelectric resonator 62 in FIG. 3A is replaced by multiple ferroelectric resonators 62(1)-62(M) and the first tuning voltage $V_{DC-1}$ in FIG. 3A is replaced by multiple first tuning voltages $V_{DC-1-1}$-$V_{DC-1-M}$. Each of the ferroelectric resonators 62(1)-62(M) can be tuned by a respective one of the first tuning voltages $V_{DC-1-1}$-$V_{DC-1-M}$ to provide a respective shunt path at a respective frequency range outside the serial resonance frequency $f_S$ of the acoustic resonator 40.

Figure 4:
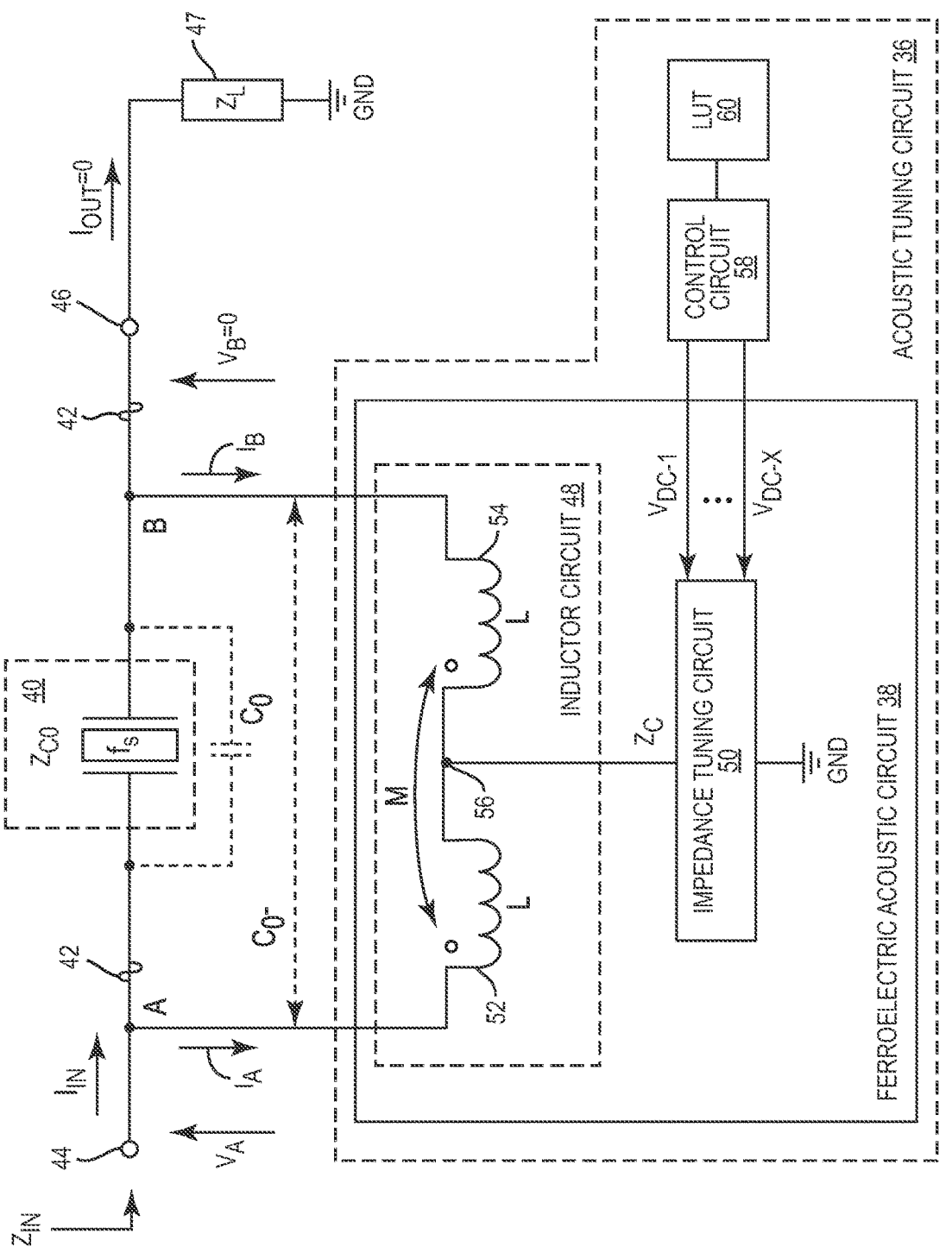
FIG. 4 is a schematic diagram providing an exemplary illustration of the acoustic tuning network of FIG. 2 configured according to an embodiment of the present disclosure to cancel the output current of the acoustic resonator.

With reference back to FIG. 2, the acoustic tuning network 36 in FIG. 2 can be tuned to selectively cancel the input current $I_{IN}$ at the signal input 44 or to cancel the output current $I_{OUT}$ at the signal output 46 by tuning the impedance tuning circuit 50. FIG. 4 is a schematic diagram providing an exemplary illustration of the acoustic tuning network 36 of FIG. 2 configured to cancel the output current $I_{OUT}$ of the acoustic resonator 40. Common elements between FIGS. 2 and 4 are shown therein with common element numbers and will not be re-described herein.

In order to cancel the output current $I_{OUT}$ (e.g., leakage current) at the signal output 46, the control circuit 58 can apply an appropriate set of the tuning voltages $V_{DC-1}$-$V_{DC-X}$ such that the shunt impedance $Z_C$ can be tuned to a value as expressed in equation (Eq. 1) below.

$$Z_C = \frac{Z_{C0} * \dfrac{k}{2(1+k)} - \dfrac{jL(1-k)\omega}{2}}{1 + \dfrac{Z_{C0}}{2jL(1+k)\omega}} \qquad \text{(Eq. 1)}$$

In the equation (Eq. 1), w represents a pulsation of the acoustic resonator 40, which can be further expressed as $2\pi f_S$. By tuning the shunt impedance $Z_C$ to cancel the output current $I_{OUT}$, an input impedance $Z_{IN}$ at the signal input 44, as expressed in equation (Eq. 2), will become dependent on the shunt impedance $Z_C$ but independent from the load impedance $Z_L$. In other words, the input impedance $Z_{IN}$ presenting at the signal input 44 remains unchanged when the load impedance $Z_L$ changes.

$$Z_{IN} = 2 * Z_C + jL(1-k)\omega \qquad \text{(Eq. 2)}$$

Figure 5:
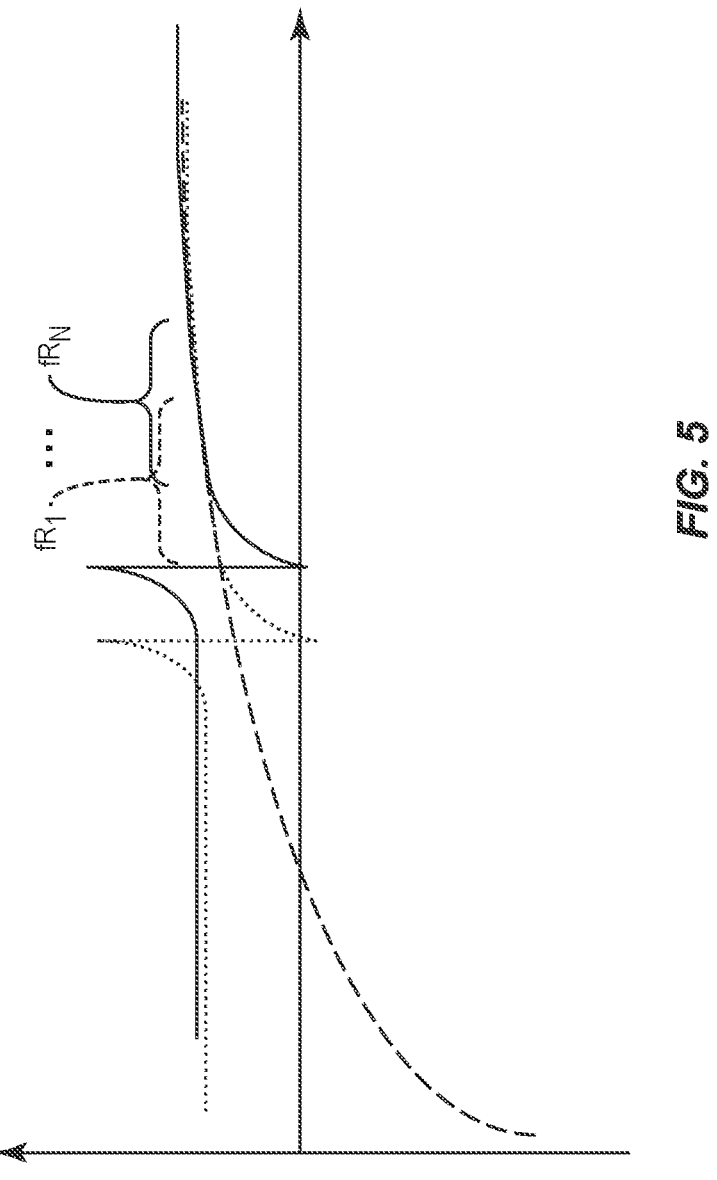
FIG. 5 is a graphic diagram providing an exemplary illustration as to how the acoustic tuning network of FIG. 2 can cancel the output current in multiple frequency ranges outside a serial resonance frequency of the acoustic resonator.

In an embodiment, the control circuit 58 may apply different sets of the tuning voltages $V_{DC-1}$-$V_{DC-X}$ to the impedance tuning circuit 50 such that the output current $I_{OUT}$ can be canceled in multiple selected frequency ranges. FIG. 5 is a graphic diagram providing an exemplary illustration as to how the acoustic tuning network 36 of FIG. 2 can cancel the output current $I_{OUT}$ in multiple frequency ranges $fR_1$-$fR_N$ outside the serial resonance frequency $f_S$ of the acoustic resonator 40.

Figure 6:
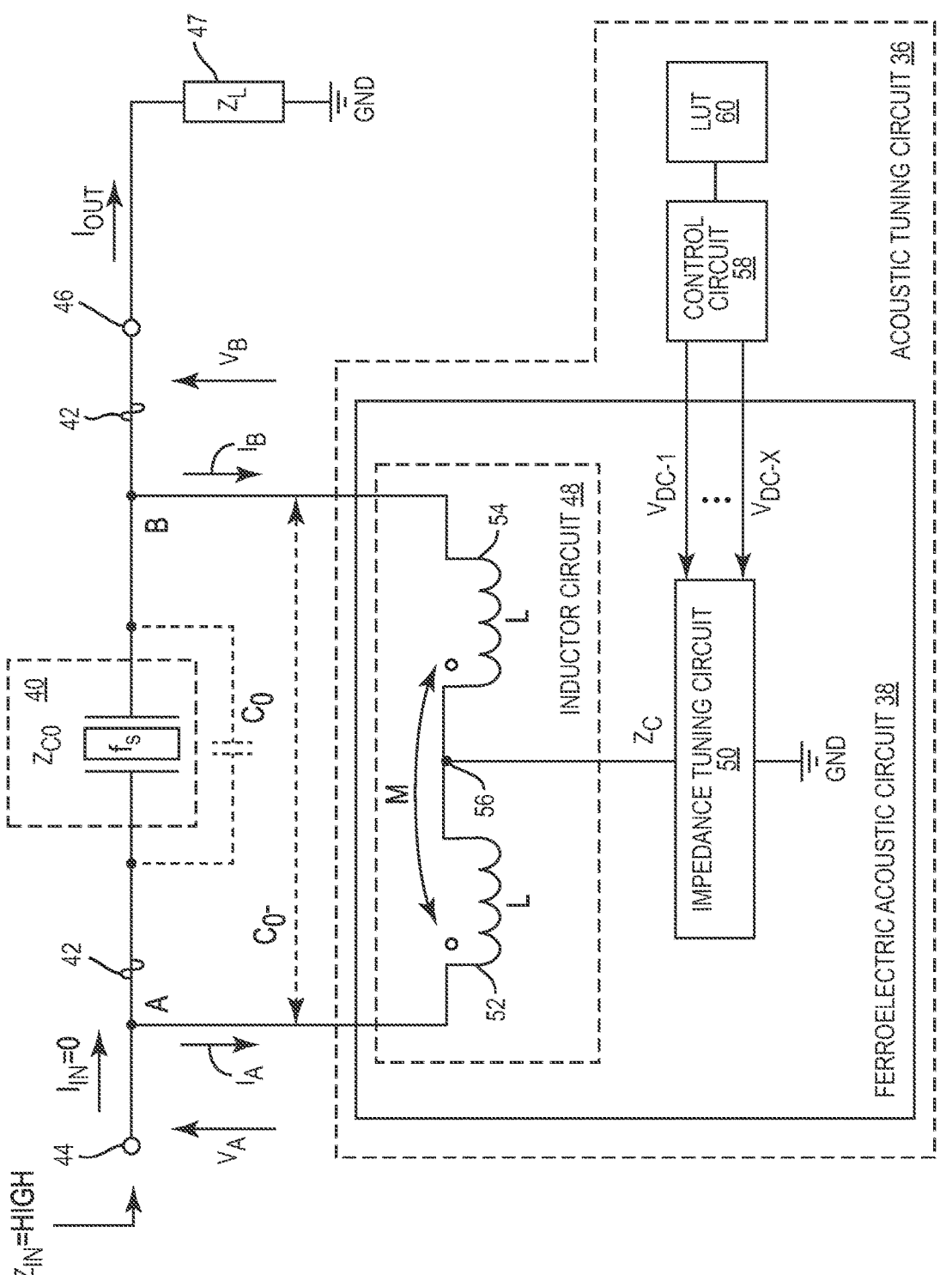
FIG. 6 is a schematic diagram providing an exemplary illustration of the acoustic tuning network of FIG. 2 configured according to an embodiment of the present disclosure to cancel the input current of the acoustic resonator.

FIG. 6 is a schematic diagram providing an exemplary illustration of the acoustic tuning network 36 of FIG. 2 configured to cancel the input current $I_{IN}$ of the acoustic resonator 40. Common elements between FIGS. 2 and 6 are shown therein with common element numbers and will not be re-described herein.

In order to cancel the input current $I_{IN}$ at the signal input 44, the control circuit 58 can apply an appropriate set of the tuning voltages $V_{DC-1}$-$V_{DC-X}$ such that the input impedance $Z_{IN}$ becomes very high. Accordingly, the shunt impedance $Z_C$ can be tuned to a value as expressed in equation (Eq. 3) below.

$$Z_C = -Z_L - \frac{\dfrac{Z_{C0}}{2(1+k)} + \dfrac{jL(1-k)\omega}{2}}{1 + \dfrac{Z_{C0}}{2jL(1+k)\omega}} \qquad \text{(Eq. 3)}$$

Figure 7:
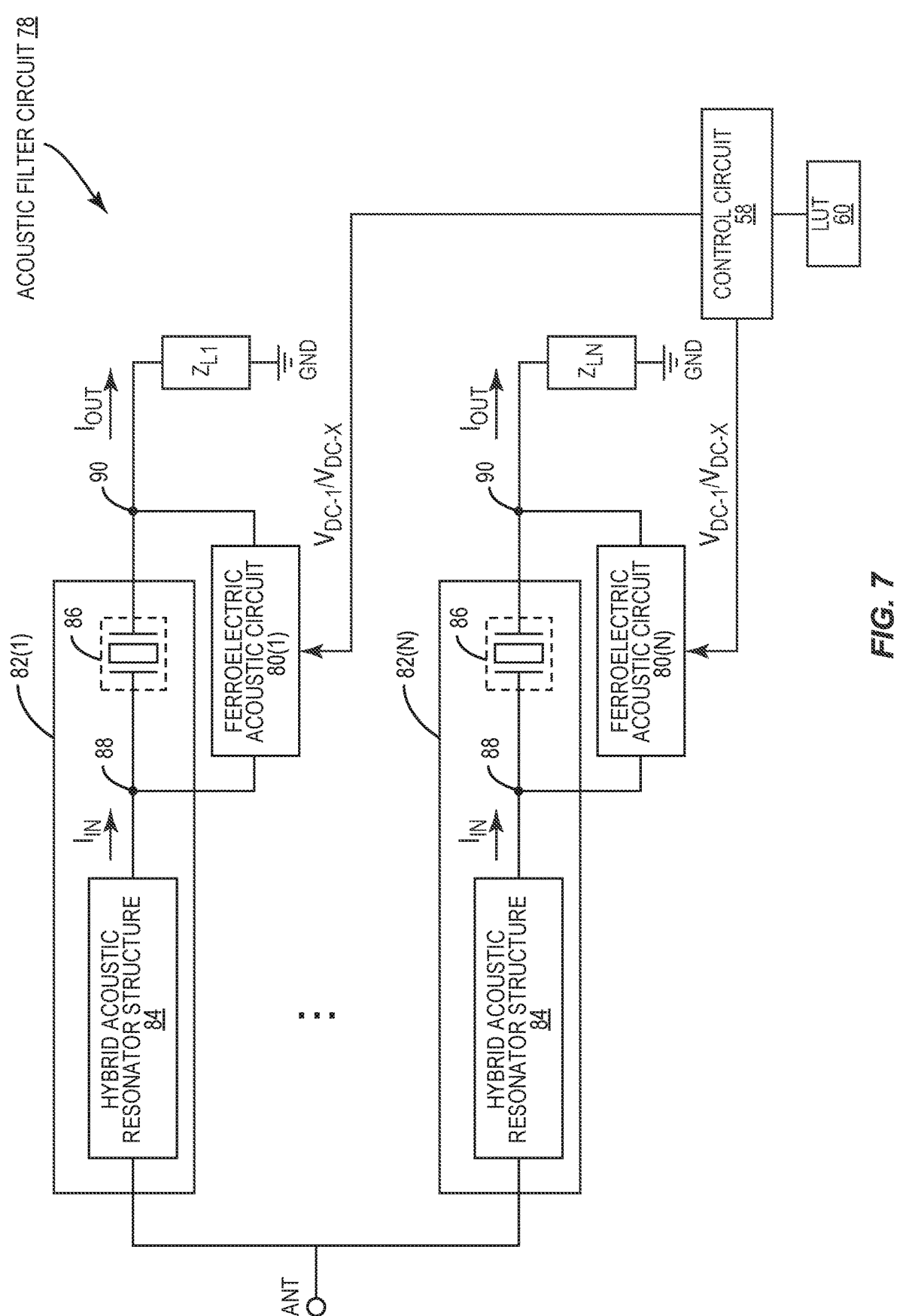
FIG. 7 is a schematic diagram of an exemplary acoustic filter circuit incorporating multiple ferroelectric acoustic circuits.

The ability to selectively cancel the input current $I_{IN}$ or the output current $I_{OUT}$ makes it possible to employ the acoustic tuning network 36 in various acoustic filter circuits (e.g., acoustic multiplexers) to support a variety of application scenarios. In this regard, FIG. 7 is a schematic diagram of an exemplary acoustic filter circuit 78 incorporating multiple ferroelectric acoustic circuits 80(1)-80(N), each of which is identical to the ferroelectric acoustic circuit 38 in FIGS. 2, 4, and 6. Common elements between FIGS. 2, 4, 6, and 7 are shown therein with common element numbers and will not be re-described herein.

The acoustic filter circuit 78 includes multiple acoustic branches 82(1)-82(N). The acoustic branches 82(1)-82(N) may be coupled in parallel to an antenna port ANT. In an example, each of the acoustic branches 82(1)-82(N) is an acoustic ladder network that includes a respective hybrid acoustic resonator structure 84 coupled in series with a respective output acoustic resonator 86, such as the acoustic resonator 40 in FIGS. 2, 4, and 6. More specifically, in each of the acoustic branches 82(1)-82(N), the respective output acoustic resonator 86 is coupled between a respective signal input 88 and a respective signal output 90. The respective signal output 90 in each of the acoustic branches 82(1)-82(N) is coupled to a respective one of multiple load impedances $Z_{L1}$-$Z_{LN}$.

In an embodiment, each of the ferroelectric acoustic circuits 80(1)-80 (N) is coupled between the respective signal input 88 and the respective signal output 90 in a respective one of the acoustic branches 82(1)-82(N). The control circuit 58 is coupled to each of the ferroelectric acoustic circuits 80(1)-80(N) and configured to tune each of the ferroelectric acoustic circuits 80(1)-80(N) via a respective set of the tuning voltages $V_{DC-1}$-$V_{DC-X}$.

In a non-limiting example, the control circuit 58 can tune each of the ferroelectric acoustic circuits 80(1)-80(N) to cancel the respective output current $I_{OUT}$ at the respective signal output 90 when the respective one of the acoustic branches 82(1)-82(N) is operational. In another non-limiting example, the control circuit 58 can tune each of the ferroelectric acoustic circuits 80(1)-80(N) to cancel the respective input current $I_{IN}$ at the respective signal input 88 when the respective one of the acoustic branches 82(1)-82(N) is nonoperational. In yet another non-limiting example, the control circuit 58 can be configured to apply different sets of the tuning voltages $V_{DC-1}$-$V_{DC-X}$ to different ones of the ferroelectric acoustic circuits 80(1)-80(N) such that some of the ferroelectric acoustic circuits 80(1)-80(N) are tuned to cancel respective input currents $I_{IN}$ while some other ones among the ferroelectric acoustic circuits 80(1)-80(N) are tuned to cancel respective output currents $I_{OUT}$.

Figure 8:
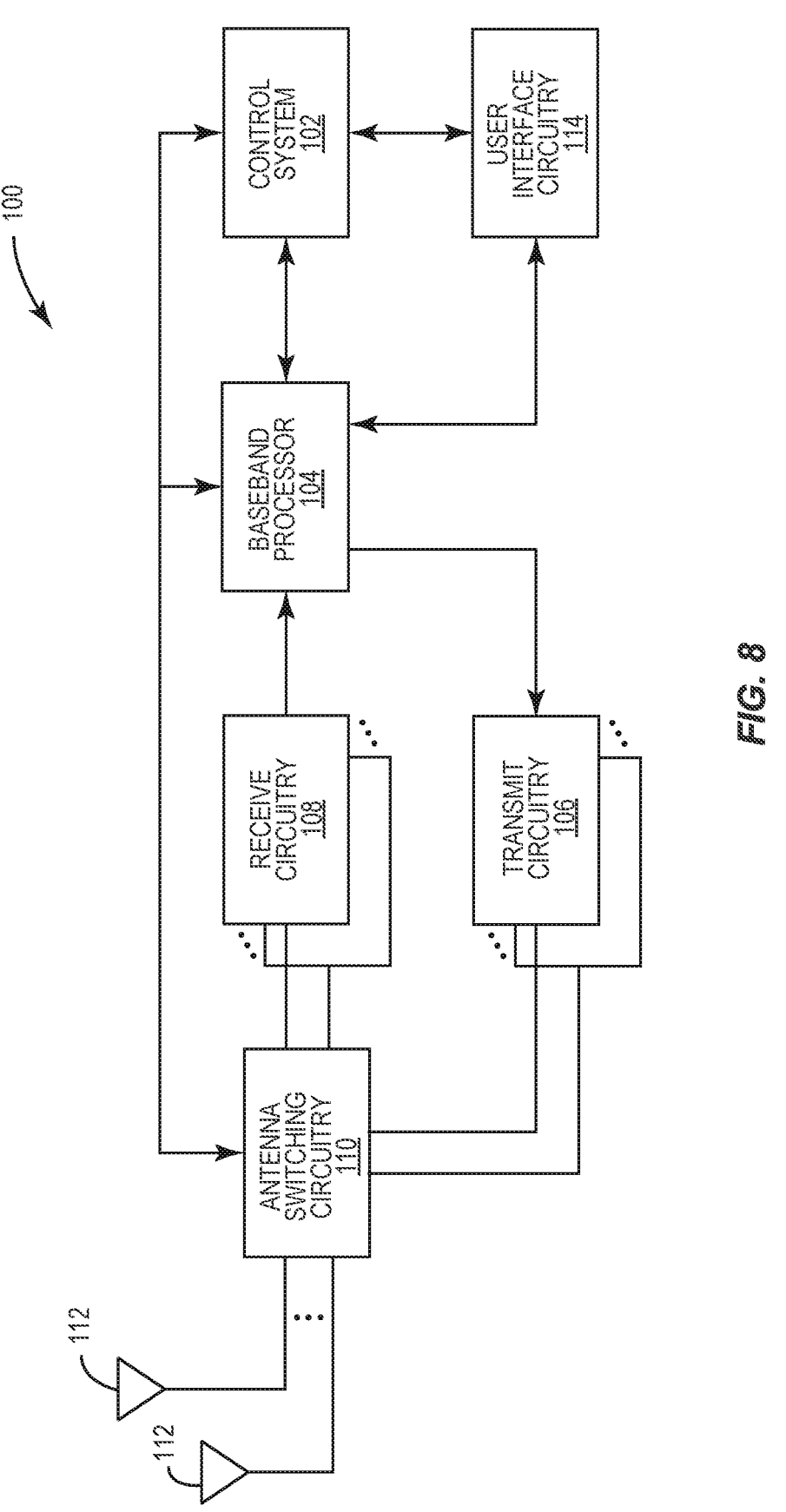
FIG. 8 is a schematic diagram of an exemplary user element wherein the acoustic tuning network of FIG. 2 and/or the acoustic filter circuit of FIG. 7 can be provided.

The acoustic tuning network 36 of FIG. 2 and/or the acoustic filter circuit 78 of FIG. 7 can be provided in a user element (e.g., a wireless device) to support the embodiments described above. In this regard, FIG. 8 is a schematic diagram of an exemplary user element 100 wherein the acoustic tuning network 36 of FIG. 2 and/or the acoustic filter circuit 78 of FIG. 7 can be provided.

Herein, the user element 100 can be any type of user elements, such as mobile terminals, smart watches, tablets, computers, navigation devices, access points, and like wireless communication devices that support wireless communications, such as cellular, wireless local area network (WLAN), Bluetooth, and near field communications. The user element 100 will generally include a control system 102, a baseband processor 104, transmit circuitry 106, receive circuitry 108, antenna switching circuitry 110, multiple antennas 112, and user interface circuitry 114. In a non-limiting example, the control system 102 can be a field-programmable gate array (FPGA), as an example. In this regard, the control system 102 can include at least a microprocessor(s), an embedded memory circuit(s), and a communication bus interface(s). The receive circuitry 108 receives radio frequency signals via the antennas 112 and through the antenna switching circuitry 110 from one or more base stations. A low noise amplifier and a filter cooperate to amplify and remove broadband interference from the received signal for processing. Downconversion and digitization circuitry (not shown) will then downconvert the filtered, received signal to an intermediate or baseband frequency signal, which is then digitized into one or more digital streams using analog-to-digital converter(s) (ADC).

The baseband processor 104 processes the digitized received signal to extract the information or data bits conveyed in the received signal. This processing typically comprises demodulation, decoding, and error correction operations, as will be discussed in greater detail below. The baseband processor 104 is generally implemented in one or more digital signal processors (DSPs) and application specific integrated circuits (ASICs).

For transmission, the baseband processor 104 receives digitized data, which may represent voice, data, or control information, from the control system 102, which it encodes for transmission. The encoded data is output to the transmit circuitry 106, where a digital-to-analog converter(s) (DAC) converts the digitally encoded data into an analog signal and a modulator modulates the analog signal onto a carrier signal that is at a desired transmit frequency or frequencies. A power amplifier will amplify the modulated carrier signal to a level appropriate for transmission and deliver the modulated carrier signal to the antennas 112 through the antenna switching circuitry 110. The multiple antennas 112 and the replicated transmit and receive circuitries 106, 108 may provide spatial diversity. Modulation and processing details will be understood by those skilled in the art.

In an embodiment, the acoustic tuning network 36 of FIG. 2 may be provided in the antenna switching circuitry 110. As an example, the signal output 46 may be coupled to the antennas 112 and the signal input 44 may be coupled to the transmit circuitry 106. In another embodiment, the acoustic filter circuit 78 of FIG. 7 may be provided in the transmit circuitry 106. As an example, the signal output 46 may be coupled to the antenna switching circuitry 110 and the signal input 44 may be coupled to the baseband processor 104.

In an embodiment, the acoustic tuning network 36 of FIG. 2 may be operated based on a process. In this regard, FIG. 9 is a flowchart of an exemplary process 200 for operating the acoustic tuning network 36 of FIG. 2.

Herein, the process 200 includes coupling the ferroelectric acoustic circuit 38 between the signal input 44 and the signal output 46 of the acoustic resonator 40 (step 202). The process 200 also includes configuring the ferroelectric acoustic circuit 38 to present the negative capacitance $C_{0-}$ between the signal input 44 and the signal output 46 (step 204). The process 200 also includes causing the ferroelectric acoustic circuit 38 to tune the negative capacitance $C_{0-}$ to cancel one of the output current $I_{OUT}$ at the signal output 46 and the input current $I_{IN}$ at the signal input 44 (step 206).

In an embodiment, the acoustic filter circuit 78 of FIG. 7 may be configured based on a process. In this regard, FIG. 10 is a flowchart of an exemplary process 208 for configuring the acoustic filter circuit 78 of FIG. 7.

Herein, the process 208 includes providing the acoustic branches 82(1)-82(N) to each include the respective output acoustic resonator 86 coupled between the respective signal input 88 and the respective signal output 90 (step 210). The process 208 also includes coupling each of the ferroelectric acoustic circuits 80(1)-80(N) in parallel to the respective output acoustic resonator 86 between the respective signal input 88 and the respective signal output 90 in a respective one of the acoustic branches 82(1)-82(N) (step 212). The process 208 also includes causing each of the ferroelectric acoustic circuits 80(1)-80(N) to cancel one of the respective output current $I_{OUT}$ at the respective signal output 90 and the respective input current $I_{IN}$ at the respective signal input 88 (step 214).

Those skilled in the art will recognize improvements and modifications to the embodiments of the present disclosure. All such improvements and modifications are considered within the scope of the concepts disclosed herein and the claims that follow.

What is claimed is:

1. An acoustic tuning network comprising:
a ferroelectric acoustic circuit comprising:
an inductor circuit coupled between a signal input and a signal output of an acoustic resonator; and
an impedance tuning circuit coupled perpendicular to the inductor circuit and configured to present a shunt impedance to the inductor circuit; and
a control circuit configured to control the impedance tuning circuit to adapt the shunt impedance to thereby cause the ferroelectric acoustic circuit to:
present a negative capacitance between the signal input and the signal output to cancel an electrical capacitance associated with the acoustic resonator; and
selectively cancel one of an output current at the signal output and an input current at the signal input to thereby make an input impedance seen at the signal input independent from a load impedance seen at the signal output.

2. The acoustic tuning network of claim 1, wherein:
the inductor circuit comprises a pair of negatively coupled inductors coupled in series between the signal input and the signal output; and
the impedance tuning circuit is coupled to an intermediate node between the pair of negatively coupled inductors in the inductor circuit and configured to present the shunt impedance at the intermediate node.

3. The acoustic tuning network of claim 2, wherein the control circuit is further configured to control the impedance tuning circuit by applying at least one set of tuning voltages to the impedance tuning circuit.

4. The acoustic tuning network of claim 3, wherein the control circuit is further configured to determine the at least one set of tuning voltages based on a lookup table (LUT).

5. The acoustic tuning network of claim 3, wherein:
the impedance tuning circuit comprises a ferroelectric resonator, a ferroelectric capacitor network, and a resistor each coupled between the intermediate node and a ground; and
the at least one set of tuning voltages comprises:
a first tuning voltage applied to a center electrode of the ferroelectric resonator; and
a second tuning voltage applied to a center node of the ferroelectric capacitor network.

6. The acoustic tuning network of claim 3, wherein:
the impedance tuning circuit comprises a plurality of ferroelectric resonators, a ferroelectric capacitor network, and a resistor each coupled between the intermediate node and a ground; and
the at least one set of tuning voltages comprises:

a plurality of first tuning voltages each applied to a respective center electrode of the plurality of ferroelectric resonators; and
a second tuning voltage applied to a center node of the ferroelectric capacitor network.

7. The acoustic tuning network of claim 3, wherein the control circuit is further configured to apply the at least one set of tuning voltages to the impedance tuning circuit to cause the ferroelectric acoustic circuit to cancel the output current to thereby make the input impedance seen at the signal input independent of the load impedance seen at the signal output.

8. The acoustic tuning network of claim 3, wherein the control circuit is further configured to apply the at least one set of tuning voltages to the impedance tuning circuit to cause the ferroelectric acoustic circuit to cancel the output current to thereby present a high input impedance at the signal input.

9. An acoustic filter circuit comprising:
a plurality of acoustic branches each comprising a respective output acoustic resonator coupled between a respective signal input and a respective signal output;
a plurality of ferroelectric acoustic circuits each comprising:
an inductor circuit coupled in parallel to the respective output acoustic resonator between the respective signal input and the respective signal output in a respective one of the plurality of acoustic branches; and
an impedance tuning circuit coupled perpendicular to the inductor circuit and configured to present a shunt impedance to the inductor circuit; and
a control circuit configured to control the impedance tuning circuit in each of the plurality of ferroelectric acoustic circuits to adapt the shunt impedance to thereby cause each of the plurality of ferroelectric acoustic circuits to:
present a negative capacitance between the signal input and the signal output to cancel an electrical capacitance associated with the respective one of the plurality of acoustic resonators; and
selectively cancel one of a respective output current at the respective signal output and a respective input current at the respective signal input to thereby make a respective input impedance seen at the signal input independent from a respective load impedance seen at the signal output.

10. The acoustic filter circuit of claim 9, wherein the control circuit is further configured to:
tune a respective one of the plurality of ferroelectric acoustic circuits to cancel the respective output current at the respective signal output when the respective one of the plurality of acoustic branches is operational; and
tune a respective one of the plurality of ferroelectric acoustic circuits to cancel the respective input current at the respective signal input when the respective one of the plurality of acoustic branches is nonoperational.

11. The acoustic filter circuit of claim 10, wherein the control circuit is further configured to:
tune the respective one of the plurality of ferroelectric acoustic circuits to cancel the respective output current at the respective signal output to thereby cause the respective input impedance seen at the signal input to become independent from the respective load impedance seen at the respective signal output; and
tune the respective one of the plurality of ferroelectric acoustic circuits to cancel the respective input current at the respective signal output to thereby present a respective high input impedance at the signal input.

12. A wireless device comprising an acoustic tuning network, comprising:

a ferroelectric acoustic circuit comprising:

an inductor circuit coupled between a signal input and a signal output of an acoustic resonator; and an impedance tuning circuit coupled perpendicular to the inductor circuit and configured to present a shunt impedance to the inductor circuit; and a control circuit configured to control the impedance tuning circuit to adapt the shunt impedance to thereby cause the ferroelectric acoustic circuit to:

present a negative capacitance between the signal input and the signal output to cancel an electrical capacitance associated with the acoustic resonator; and selectively cancel one of an output current at the signal output and an input current at the signal input to thereby make an input impedance seen at the signal input independent from a load impedance seen at the signal output.

13. The wireless device of claim 12, wherein:

the inductor circuit comprises a pair of negatively coupled inductors coupled in series between the signal input and the signal output; and the impedance tuning circuit is coupled to an intermediate node between the pair of negatively coupled inductors in the inductor circuit and configured to present the shunt impedance at an intermediate node.

14. The wireless device of claim 13, wherein the control circuit is further configured to control the impedance tuning circuit by applying at least one set of tuning voltages to the impedance tuning circuit.

15. The wireless device of claim 14, wherein the control circuit is further configured to apply the at least one set of tuning voltages to the impedance tuning circuit to cause the ferroelectric acoustic circuit to cancel the output current to thereby make the input impedance seen at the signal input independent of the load impedance seen at the signal output.

16. The wireless device of claim 14, wherein the control circuit is further configured to apply the at least one set of tuning voltages to the impedance tuning circuit to cause the ferroelectric acoustic circuit to cancel the output current to thereby present a high input impedance at the signal input.

17. A wireless device comprising an acoustic filter circuit, comprising:

a plurality of acoustic branches each comprising a respective output acoustic resonator coupled between a respective signal input and a respective signal output;

a plurality of ferroelectric acoustic circuits each comprising:

an inductor circuit coupled in parallel to the respective output acoustic resonator between the respective signal input and the respective signal output in a respective one of the plurality of acoustic branches; and an impedance tuning circuit coupled perpendicular to the inductor circuit and configured to present a shunt impedance to the inductor circuit; and a control circuit configured to control the impedance tuning circuit in each of the plurality of ferroelectric acoustic circuits to adapt the shunt impedance to thereby cause each of the plurality of ferroelectric acoustic circuits to:

present a negative capacitance between the signal input and the signal output to cancel an electrical capacitance associated with the respective one of the plurality of acoustic resonators; and selectively cancel one of a respective output current at the respective signal output and a respective input current at the respective signal input to thereby make a respective input impedance seen at the signal input independent from a respective load impedance seen at the signal output.

18. The wireless device of claim 17, wherein the control circuit is further configured to:

tune a respective one of the plurality of ferroelectric acoustic circuits to cancel the respective output current at the respective signal output when the respective one of the plurality of acoustic branches is operational; and tune a respective one of the plurality of ferroelectric acoustic circuits to cancel the respective input current at the respective signal input when the respective one of the plurality of acoustic branches is nonoperational.

19. A method for operating an acoustic tuning network comprising:

coupling an inductor circuit in a ferroelectric acoustic circuit between a signal input and a signal output of an acoustic resonator;

coupling an impedance tuning circuit perpendicular to the inductor circuit to present a shunt impedance to the inductor circuit;

controlling the impedance tuning circuit to adapt the shunt impedance to thereby cause the ferroelectric acoustic circuit to:

present a negative capacitance between the signal input and the signal output to cancel an electrical capacitance associated with the acoustic resonator; and selectively cancel one of an output current at the signal output and an input current at the signal input to thereby make an input impedance seen at the signal input independent from a load impedance seen at the signal output.

20. A method for operating an acoustic filter circuit comprising:

providing a plurality of acoustic branches to each include a respective output acoustic resonator coupled between a respective signal input and a respective signal output;

coupling an inductor circuit in each of a plurality of ferroelectric acoustic circuits in parallel to the respective output acoustic resonator between the respective signal input and the respective signal output in a respective one of the plurality of acoustic branches;

coupling an impedance tuning circuit perpendicular to the inductor circuit to present a shunt impedance to the inductor circuit; and controlling the impedance tuning circuit in each of the plurality of ferroelectric acoustic circuits to adapt the shunt impedance to thereby cause each of the plurality of ferroelectric acoustic circuits to:

present a negative capacitance between the signal input and the signal output to cancel an electrical capacitance associated with the respective one of the plurality of acoustic resonators; and selectively cancel one of a respective output current at the respective signal output and a respective input current at the respective signal input to thereby make a respective input impedance seen at the signal input independent from a respective load impedance seen at the signal output.

* * * * *